(12) United States Patent
Vrankovic et al.

(10) Patent No.: US 12,362,634 B2
(45) Date of Patent: Jul. 15, 2025

(54) SYSTEM AND METHOD FOR COOLING SWITCHING DEVICES IN AN INTEGRATED MOTOR DRIVE

(71) Applicant: Rockwell Automation Technologies, Inc., Mayfield Heights, OH (US)

(72) Inventors: Zoran Vrankovic, Greenfield, WI (US); Kristin N. Yee, Cedarburg, WI (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 894 days.

(21) Appl. No.: 17/536,891

(22) Filed: Nov. 29, 2021

(65) Prior Publication Data
US 2023/0170765 A1 Jun. 1, 2023

(51) Int. Cl.
*H02K 9/22* (2006.01)
*H02K 11/33* (2016.01)

(52) U.S. Cl.
CPC ............. *H02K 9/223* (2021.01); *H02K 9/22* (2013.01); *H02K 11/33* (2016.01); *H02K 2211/03* (2013.01)

(58) Field of Classification Search
CPC .. H05K 7/2089; H05K 7/20463; H02K 11/33; H02K 11/30; H02K 9/223; H02K 2211/03; H02K 9/22; H02K 9/227; H02K 9/00
USPC ...................................................... 310/52, 64
See application file for complete search history.

(56) References Cited

U.S. PATENT DOCUMENTS

| | | | |
|---|---|---|---|
| 2006/0279162 A1 | 12/2006 | Achor et al. | |
| 2008/0018196 A1* | 1/2008 | Enomoto | H02K 1/145 310/43 |
| 2012/0313467 A1* | 12/2012 | Omae | B62D 5/0406 310/71 |

(Continued)

FOREIGN PATENT DOCUMENTS

| | | | |
|---|---|---|---|
| JP | 2014143841 A | * | 8/2014 |
| WO | 2019/117119 A1 | | 6/2019 |

OTHER PUBLICATIONS

Yoshida Hideho, Inverter Integrated Motor, Aug. 7, 2014, JP 2014143841 (English Machine Translation) (Year: 2014).*

(Continued)

*Primary Examiner* — Alexander A Singh
(74) *Attorney, Agent, or Firm* — Boyle Fredrickson, S.C.

(57) ABSTRACT

Power semiconductor switching devices in an integrated motor drive are mounted directly to a circuit board substrate via a "pick and place" assembly process. The circuit board substrate is then mounted within the housing for the integrated motor drive and, preferably, in a generally central orientation within the housing. A potting material is provided within the housing of the integrated motor drive and around the circuit board. The potting material substantially encloses the circuit board and fills the volume within the integrated motor drive. The potting material is selected to provide good thermal conductivity between the circuit board and the housing of the integrated motor drive. The potting material is also selected to provide flexibility such that expansion and contraction of the potting material due to heating and cooling of the material does not damage the circuit board or the electronic components mounted to the circuit board.

18 Claims, 5 Drawing Sheets

(56) References Cited

U.S. PATENT DOCUMENTS

| | | |
|---|---|---|
| 2013/0069454 A1 | 3/2013 | Motoda |
| 2013/0301328 A1 | 11/2013 | Ito |
| 2014/0210396 A1* | 7/2014 | Yamanaka .............. H02P 25/06 |
| | | 318/687 |
| 2014/0265741 A1* | 9/2014 | Vrankovic ......... H02K 11/0094 |
| | | 310/68 C |
| 2017/0187267 A1 | 6/2017 | Krah |
| 2018/0034346 A1 | 2/2018 | Purohit et al. |
| 2018/0069458 A1* | 3/2018 | Hirabayashi ......... H01R 39/381 |
| 2020/0060035 A1 | 2/2020 | Hansen |
| 2021/0053764 A1* | 2/2021 | Hofer ..................... H02G 5/025 |
| 2022/0231569 A1* | 7/2022 | Hellinger ........... H01R 13/2428 |

OTHER PUBLICATIONS

Extended European Search Report dated Apr. 3, 2023; Application No. 22205795.2—(8) pages.

* cited by examiner

SYSTEM AND METHOD FOR COOLING SWITCHING DEVICES IN AN INTEGRATED MOTOR DRIVE

BACKGROUND INFORMATION

The subject matter disclosed herein relates to a system and method for cooling power semiconductor devices in an integrated motor drive. More specifically, the power semiconductor devices are mounted to a circuit board and installed within a housing for the integrated motor drive. The interior of the housing is filled with a potting material providing a thermal conduction path for heat to transfer from the power semiconductor devices to the housing and then through the housing to the ambient environment.

Electrical rotating machines, such as electric motors or generators, have become widespread and are found in numerous applications and configurations. Electric machines include a stationary component (i.e., the stator) and a rotating component (i.e., the rotor). In electric motors, a magnetic field is established in the rotor, for example via magnets mounted to the rotor or via an electrical current applied to, or induced in, a coil wound on the rotor. A second, rotating magnetic field is established as a result of a stator current produced by a controlled voltage applied to the stator. Rotation of the magnetic field in the stator causes the magnetic field in the rotor to follow the stator field, thereby causing rotation of the rotor. A shaft or other drive member is mounted to the rotor and extends outside the rotor housing providing a mechanical coupling to a device, such as a gearbox, pump, or fan that is to be driven as the rotor rotates. The amplitude and frequency of the controlled voltage applied to the stator is varied to achieve desired operation of the motor.

As is known to those skilled in the art, motor controllers, also referred to herein as motor drives, are utilized to vary the amplitude and frequency of the voltage applied to a motor to achieve desired operation of the motor. A motor controller is configured to receive power at an input, where the input power may be supplied from either an alternating current (AC) source or a direct current (DC) source. If the input power is supplied from an AC source, a rectifier section converts the AC power to DC power. The DC bus, either from the output of the rectifier section or supplied directly from the DC source, is provided to a DC bus within the motor controller. A current regulator and modulation techniques are used to control an inverter section which, in turn, supplies the required current and voltage to the motor from the DC bus to achieve desired operation of the motor.

The inverter section includes power semiconductor switching devices such as bipolar junction transistors (BJTs), insulated gate bipolar transistors (IGBTs), or metal oxide semiconductor field effect transistors (MOSFETs). The switching devices are rapidly switched on and off to alternately connect a positive DC voltage, a negative DC voltage, or a common voltage on the DC bus to the output of the inverter section. Using known switching algorithms, the voltage at the output of the inverter section will have a fundamental AC component at a desired amplitude and frequency which will provide desired operation of a motor.

The power semiconductor switching devices, however, experience power losses within the device during operation. Some power is dissipated in each device from current conducted through each device, also referred to as conduction losses. Additional power is dissipated in each device when the device transitions between OFF and ON states, also referred to as switching losses. Still additional power is dissipated in each device from other causes, also referred to as parasitic losses. The power dissipated in each device tends to be converted to heat energy within the device, causing the temperature of the device to rise. It is important to remove the heat from the power switching devices to avoid a catastrophic failure of the switching device.

Historically, motor drives have been mounted inside control cabinets. The control cabinet may include an air conditioning unit to remove heat from within the cabinet. In some applications, the cabinet itself may be located in an environmentally controlled space, such that heat generated within the motor drive may be easily removed. However, recent improvements in motor drives have resulted in the motor drive being mounted to the motor. A motor drive mounted on the motor is referred to as an integrated motor drive. Because the motor drive is mounted on the motor, it is no longer located within a control cabinet but rather is located in the manufacturing or other environment in which the controlled machine or process is located. The ambient temperature for the controlled machine or process may be greater than within a control cabinet or within a control room housing the control cabinet. Thus, heat management for an integrated motor drive is more challenging than for a cabinet-mounted motor drive.

In order to assist with dissipating heat generated in an integrated motor drive, the power semiconductor switching devices have commonly been mounted to a copper baseplate using a Direct Bond Copper (DBC) process. The copper baseplate serves as a heat sink for the DBC mounted power semiconductor devices, and the copper baseplate is mounted to the housing of the integrated motor drive. The integrated motor drive is, in turn, typically mounted to a side of the motor housing, where the outside surface of the wall for the motor drive housing that is mounted to the motor has the copper baseplate mounted to the inside surface. This mounting arrangement provides a thermal conduction path from the switching devices, through the copper baseplate, through the integrated motor drive housing, and into the housing for the motor. Heat is then be radiated out to the ambient environment from the motor housing.

However, mounting the integrated motor drive to the side of the motor housing is not without drawbacks. The motor also generates heat during normal operation which is dissipated through the housing of the motor. The heat generated in the motor is a result of the current flowing in the motor, and the amount of current flowing in the motor corresponds to the torque the motor is able to produce. If additional heat is being transferred to the motor housing from the integrated motor drive, the total heat generated by the motor and the integrated motor drive must be limited.

Limiting the amount of heat generated by the motor, the integrated motor drive, or both is done by derating the devices. Derating the motor requires limiting the maximum amount of current which may be conducted by the motor and, as a result, limiting the amount of torque produced by the motor. Derating the integrated motor drive requires limiting the amount of current conducted through the power switching devices when compared to a similarly sized motor drive that is cabinet-mounted. Limiting the current in the motor drive, in turn, limits the amount of heat generated within the power switching devices. As still another option, both the motor and the motor drive may have some derating, such that the heat generated by both elements may be successfully dissipated from the motor housing.

Derating either the motor or the motor drive, however, requires larger motors or larger motor drives to handle the same power and to provide the same amount of work as a motor controlled by a cabinet-mounted motor drive. The larger devices increase the size and cost of the system.

Thus, it would be desirable to provide an improved system and method for cooling switching devices in an integrated motor drive.

BRIEF DESCRIPTION

According to one embodiment of the invention, a system for cooling switching devices in a motor drive includes a housing for the motor drive, where the housing for the motor drive is configured to mount to a motor housing. A volume is defined within an inner periphery of the housing, and at least one switching device is mounted within the motor drive. The at least one switching device is operatively controlled to convert a first voltage present on a DC bus within the motor drive to a second voltage present at an output of the motor drive, and the second voltage is configured to control operation of a motor to which the motor drive is mounted. A circuit board, on which each of the at least one switching devices is mounted, is mounted within the volume of the housing for the motor drive. A potting material is inserted into the volume of the housing for the motor drive after the circuit board is mounted, and the potting material covers each switching device mounted on the circuit board and extends from the circuit board to the inner periphery of the housing for the motor drive.

According to another embodiment of the invention, a method for cooling switching devices in a motor drive includes mounting at least one switching device to a circuit board and mounting the circuit board with each switching device in a housing for the motor drive. The housing for the motor drive is configured to mount to a motor housing. A volume within the housing is filled with a potting material. The potting material covers each switching device mounted on the circuit board and extends from the circuit board to an inner periphery of the housing for the motor drive. The switching device is operatively controlled to convert a first voltage present on a DC bus within the motor drive to a second voltage present at an output of the motor drive. Heat generated from controlling the at least one switching device is conducted via the potting material to the housing for the motor drive.

These and other advantages and features of the invention will become apparent to those skilled in the art from the detailed description and the accompanying drawings. It should be understood, however, that the detailed description and accompanying drawings, while indicating preferred embodiments of the present invention, are given by way of illustration and not of limitation. Many changes and modifications may be made within the scope of the present invention without departing from the spirit thereof, and the invention includes all such modifications.

BRIEF DESCRIPTION OF THE DRAWINGS

Various exemplary embodiments of the subject matter disclosed herein are illustrated in the accompanying drawings in which like reference numerals represent like parts throughout, and in which.

In describing the various embodiments of the invention which are illustrated in the drawings, specific terminology will be resorted to for the sake of clarity. However, it is not intended that the invention be limited to the specific terms so selected and it is understood that each specific term includes all technical equivalents which operate in a similar manner to accomplish a similar purpose. For example, the word "connected," "attached," or terms similar thereto are often used. They are not limited to direct connection but include connection through other elements where such connection is recognized as being equivalent by those skilled in the art.

DETAILED DESCRIPTION

The various features and advantageous details of the subject matter disclosed herein are explained more fully with reference to the non-limiting embodiments described in detail in the following description.

The subject matter disclosed herein describes an improved system and method for cooling switching devices in an integrated motor drive. As previously discussed, mounting an integrated motor drive to a motor has previously required derating the motor, the motor drive, or a combination of the motor and motor drive. In addition, the DBC mounting process further requires a complex assembly process. After mounting the power semiconductor switching devices to the copper baseplate, the terminals of the switching devices must be connected to a circuit board to receive control signals. The terminals of the power semiconductor devices require bond wires connected between the terminals and a circuit board substrate using a wire-bonding process that requires specialized knowledge.

In contrast, the present invention allows the power semiconductor switching devices to be mounted directly to the circuit board substrate. Each switching device may be mounted to the circuit board substrate via a "pick and place" assembly process. The terminals of the switching devices are soldered to pads on the circuit board. Mounting the switching devices via the pick and place process eliminates the wire-bonding process, simplifying construction and reducing the cost of the integrated motor drive.

As also previously discussed, the construction of integrated motor drives has previously resulted in heat transfer from the motor drive to the housing of the motor. The heat transfer was due primarily to mounting the copper baseplate to a surface of the housing for the integrated motor drive which was, in turn, mounted to a surface of the motor housing. The primary thermal conduction path from the integrated motor drive has been through the motor housing.

In contrast, the present invention contemplates that the housing for the integrated motor drive is mounted to an end of the motor housing. The integrated motor drive according to the present invention is configured to conduct heat to the sides of the motor drive housing and out to the ambient environment. Mounting the integrated motor drive to the end of the motor housing significantly reduces or eliminates the heat transfer to the motor housing and, in turn, significantly reduces or eliminates the need to derate the motor and/or integrated motor drive.

Conduction of heat to the sides of the integrated motor drive is a function of how the power semiconductor devices are mounted within the integrated motor drive. After mounting the power semiconductor switching devices to the circuit board substrate, the circuit board substrate is then mounted within the housing for the integrated motor drive and, preferably, in a generally central orientation within the housing. The circuit board substrate, however, typically provides better thermal insulation than conduction. Similarly, air around the switching devices serves as a poor thermal conductor. As a result, a potting material is provided within the housing of the integrated motor drive and around the circuit board. The potting material substantially encloses the circuit board and fills the volume within the integrated motor drive. The potting material is selected to provide good thermal conductivity between the circuit board and the housing of the integrated motor drive. The potting material is also selected to provide flexibility such that expansion and contraction of the potting material due to heating and cooling of the material does not damage the circuit board or the electronic components mounted to the circuit board. The present invention, therefore, provides a simplified construction process and reduces, or potentially eliminates, the need for derating of the motor or integrated motor drive.

Figure 1:
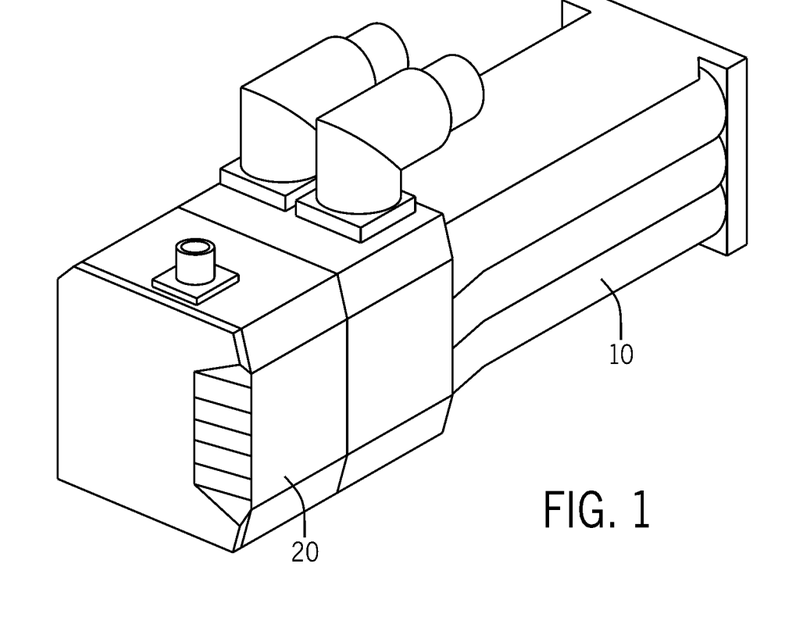
FIG. 1 is a perspective view of an integrated motor drive mounted to the end of a motor according to one embodiment of the invention.
Figure 2:
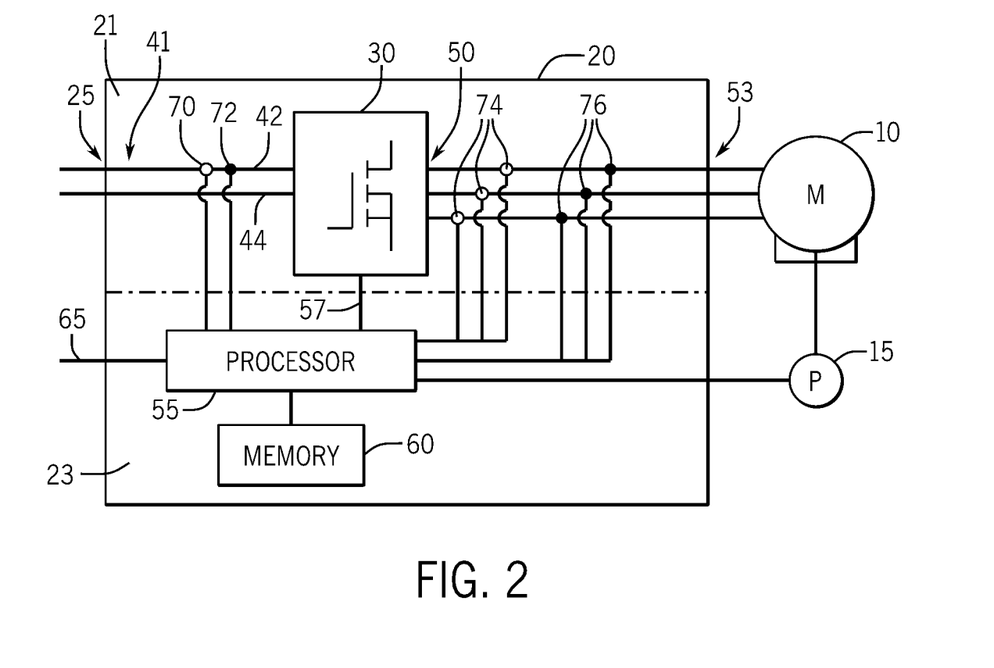
FIG. 2 is an exemplary schematic representation of the integrated motor drive of FIG. 1.

Turning initially to FIGS. 1 and 2, an exemplary integrated motor drive 20 is illustrated mounted to a motor 10. The integrated motor drive 20 includes a power section 21 and a control section 23. The power section 21 includes components typically handling, for example, 200-528 VAC or 200-800 VDC, and the power section 61 receives power in one form and utilizes power switching devices to regulate power output to the motor 10 in a controlled manner to achieve desired operation of the motor 10. The control section 23 includes components typically handling, for example 110 VAC or 3.3-58 VDC and, the control section 23 includes processing devices, feedback circuits, and supporting logic circuits to receive feedback signals and generate control signals within the motor drive 20.

The power section 21 is configured to receive a first voltage at an input 25 and provide a second voltage at an output 53. According to the illustrated embodiment, the input 25 receives a DC voltage, which is provided to a positive rail 42 and a negative rail 44 of a DC bus 41 within the integrated motor drive 20. It is contemplated that a rectifier unit or an active front end (AFE) may be provided within a control cabinet at a location remote from the integrated motor drive 20. The rectifier unit or AFE receives an AC voltage, for example, from a utility grid, and converts the AC voltage to a DC voltage for delivery to the integrated motor drive 20. The rectifier unit or AFE may be sized such that it may supply a DC voltage to multiple integrated motor drives 20 distributed about the controlled machine or process. A rectifier section will typically include electronic devices, such as diodes, suitable for passive rectification of the AC voltage to a DC voltage. An AFE will typically include other solid-state devices including, but not limited to, thyristors, silicon-controlled rectifiers (SCRs), or transistors which receive control signals to convert an AC voltage to a DC voltage for the DC bus 41. According to another aspect of the invention, a rectifier unit or AFE may be included within the integrated motor drive 20 and the integrated motor drive 20 may receive an AC voltage and covert the AC voltage to a DC voltage internal to the integrated motor drive.

Figure 3:
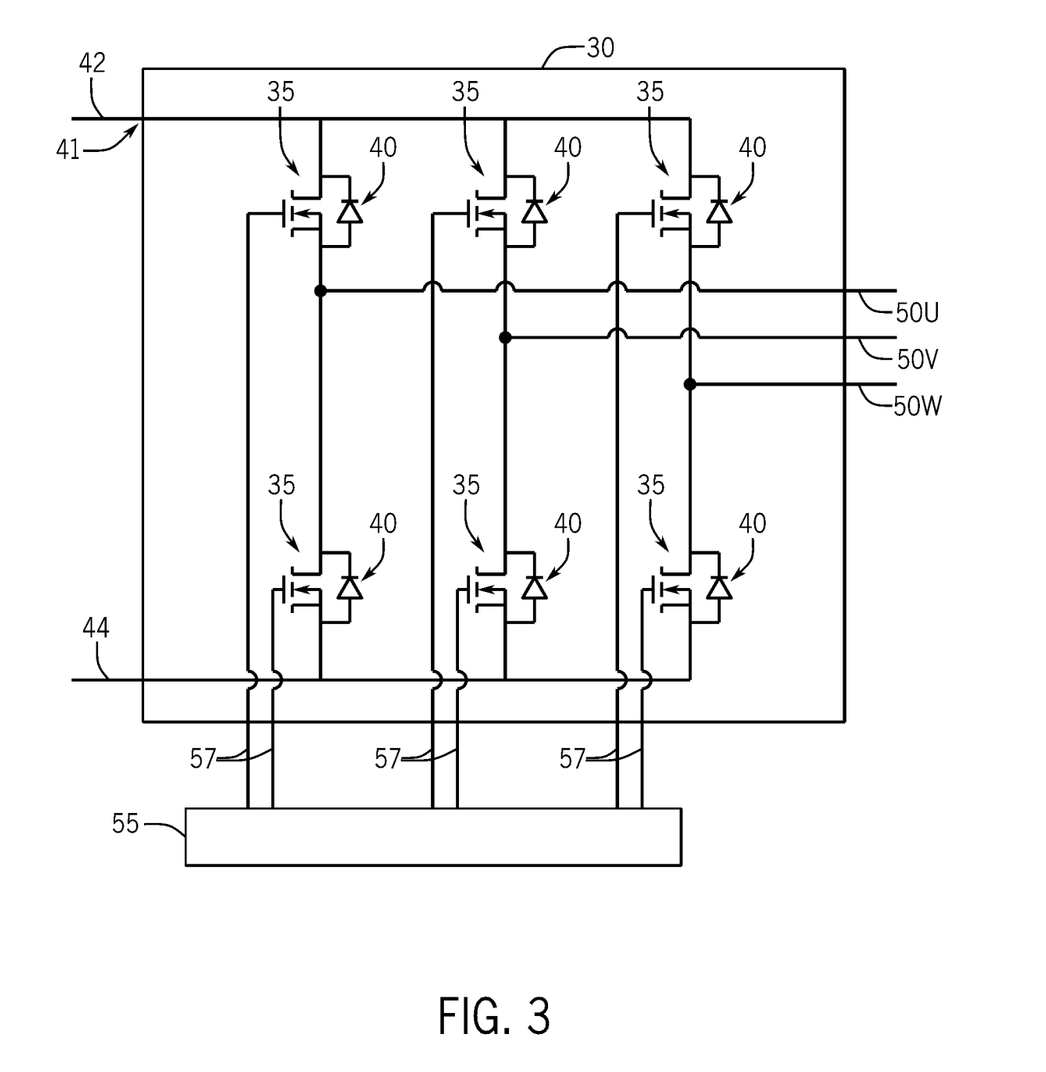
FIG. 3 is a schematic representation of the inverter section for the integrated motor drive of FIG. 2.

The DC bus 41 supplies the DC voltage present on the bus as an input to an inverter section 30. Referring also to FIG. 3, the inverter section 30 consists of switching elements, such as transistors, thyristors, or SCRs as is known in the art. The illustrated inverter section 30 includes a MOSFET 35 and a free-wheeling diode 40 connected in pairs between the positive rail 42 and each phase of the output voltage as well as between the negative rail 44 and each phase of the output voltage. Each of the MOSFETs 35 receives gating signals 57 to selectively enable the transistor and to convert the DC voltage from the DC bus 41 into a controlled three phase output voltage to the motor 10. According to the illustrated embodiment, a processor 55 in the motor drive 20 may be configured to generate the gating signals 57. Optionally, a processor 55 may execute a control module, as discussed further below, and provide a voltage reference signal to a gate drive module. The gate drive module converts the voltage reference signal to the gating signals 57 to control operation of each transistor 35. When enabled, each transistor 35 connects the respective rail 42, 44 of the DC bus 41 to the inverter output 50. The illustrated inverter output 50 supplies a three-phase AC voltage to the motor, where a first phase is present on 50U, a second phase is present on 50V, and a third phase is present on 50 W. The inverter output 50 is connected to the motor drive output 53 and, in turn, to the motor 10.

The processor 55 in the motor drive 20 receives a reference signal 65 identifying desired operation of the motor 10 connected to the motor drive. The reference signal 65 may be, for example, a position reference ($\theta^*$), a speed reference ($\omega^*$), or a torque reference ($T^*$). The processor 55 also receives feedback signals indicating the current operation of the motor drive 20. A position feedback device 15 is operatively connected to the motor 10 to provide a position feedback signal to the motor drive 20. The position feedback signal may be an analog signal, such as a sinusoidal signal, a series of pulses, provided singularly or in quadrature, or a digital data packet according to a serial communication protocol for the position feedback device 15. The position feedback signal provides angular position of the motor 10 to the motor drive 20 used to control operation of the motor 10.

As illustrated, feedback signals are provided directly to the processor 55. This is for ease of illustration. Feedback signals will typically include additional logic circuits including, but not limited to, analog to digital (A/D) converters, buffers, amplifiers, and any other components that would be necessary to convert a feedback signal in a first format to a signal in a second format suitable for use by the processor 55 as would be understood in the art. The motor drive 20 may include a voltage sensor 70 and/or a current sensor 72 on the DC bus 41 generating a feedback signal corresponding to the magnitude of voltage and/or current present on the DC bus 41. The motor drive 20 may also include one or more voltage sensors 74 and/or current sensors 76 on the output phase(s) of the inverter section 30 generating a feedback signal corresponding to the magnitude of voltage and/or current present at the output 53 of the motor drive 20. The processor 55 utilizes the feedback signals and the reference signal 65 to control operation of the inverter section 30 to generate an output voltage having a desired magnitude and frequency for the motor 10.

Figure 4:
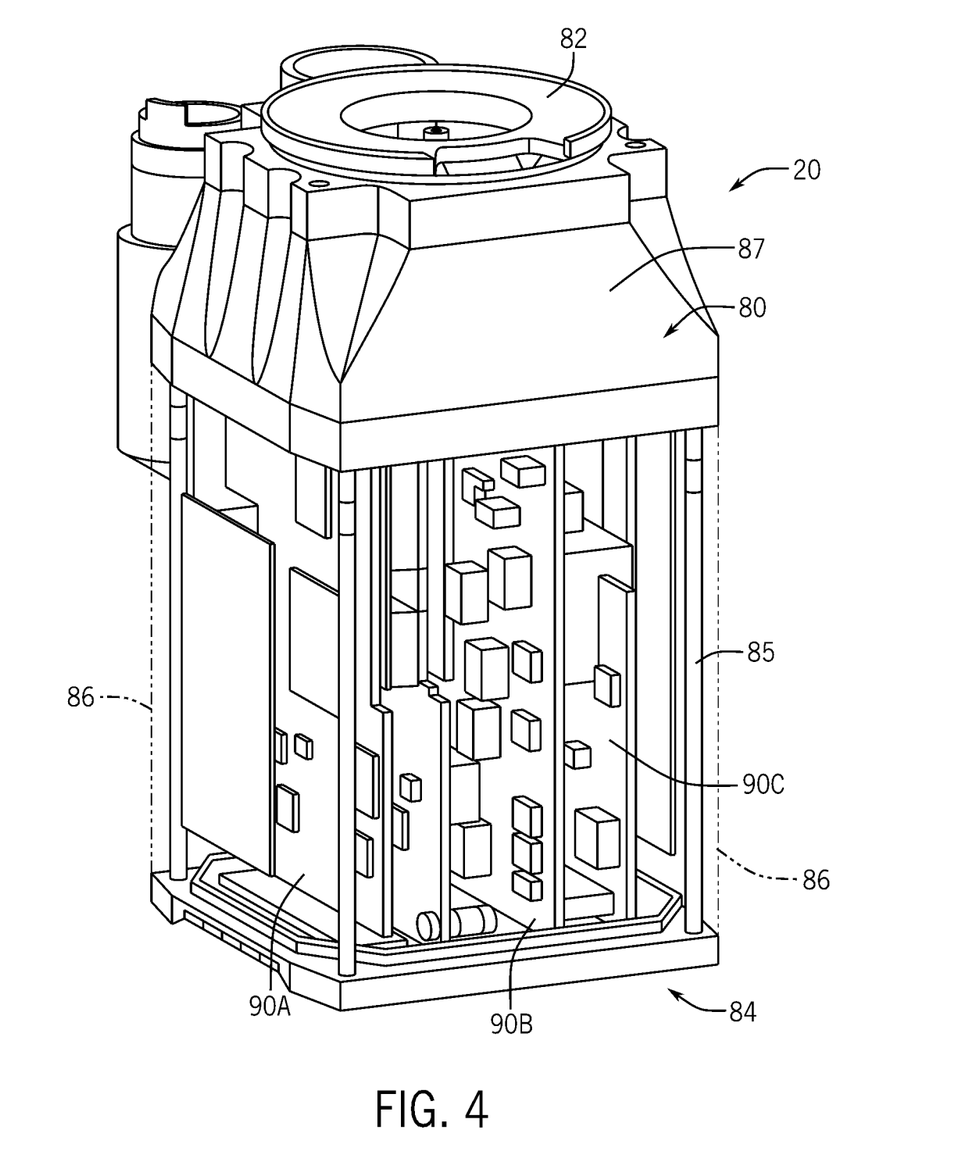
FIG. 4 is a perspective view of an integrated motor drive according to another embodiment of the invention with a portion of the housing removed.
Figure 5:
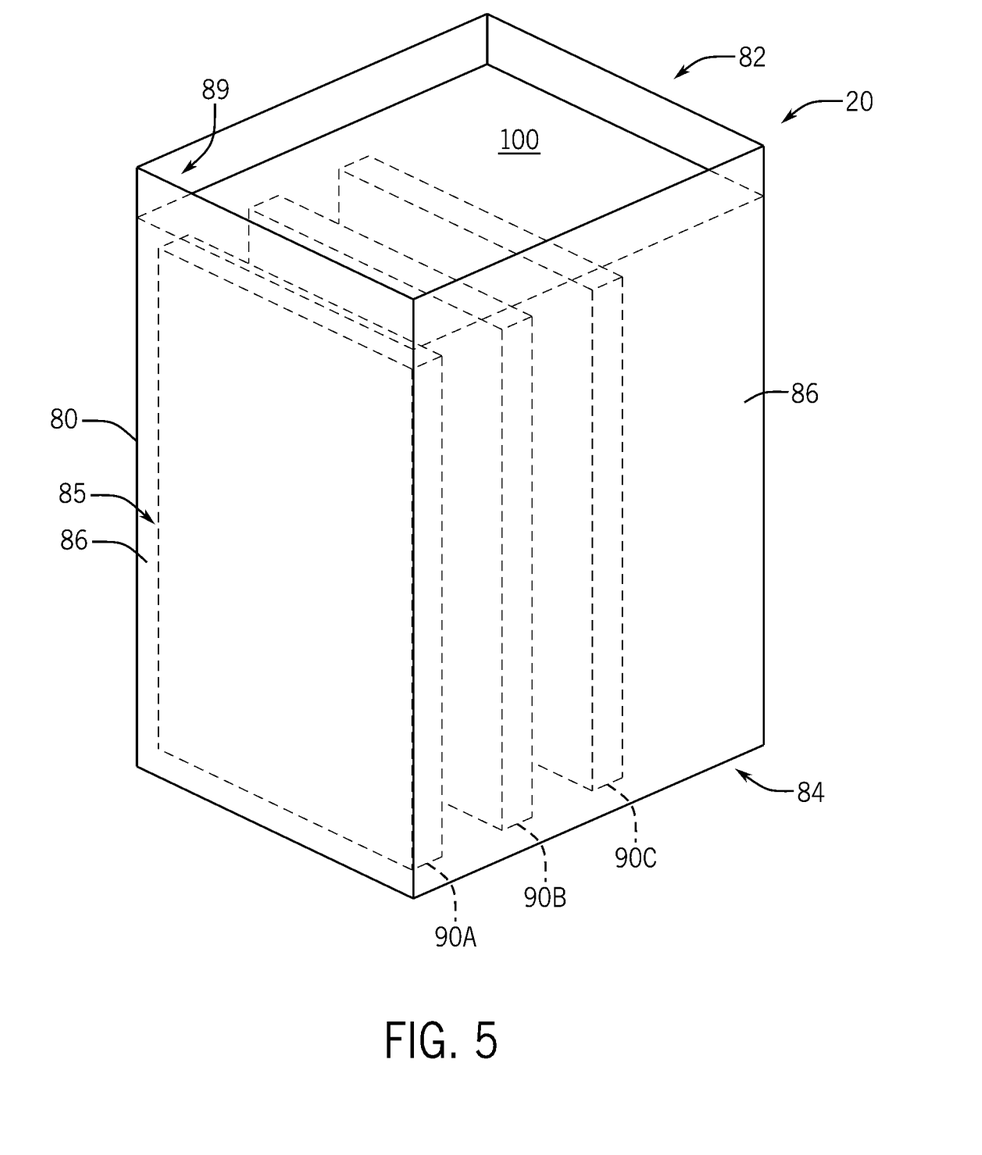
FIG. 5 is a partial perspective view of the integrated motor drive of FIG. 4 illustrating potting material and mounting of circuit boards within the integrated motor drive.
Figure 6:
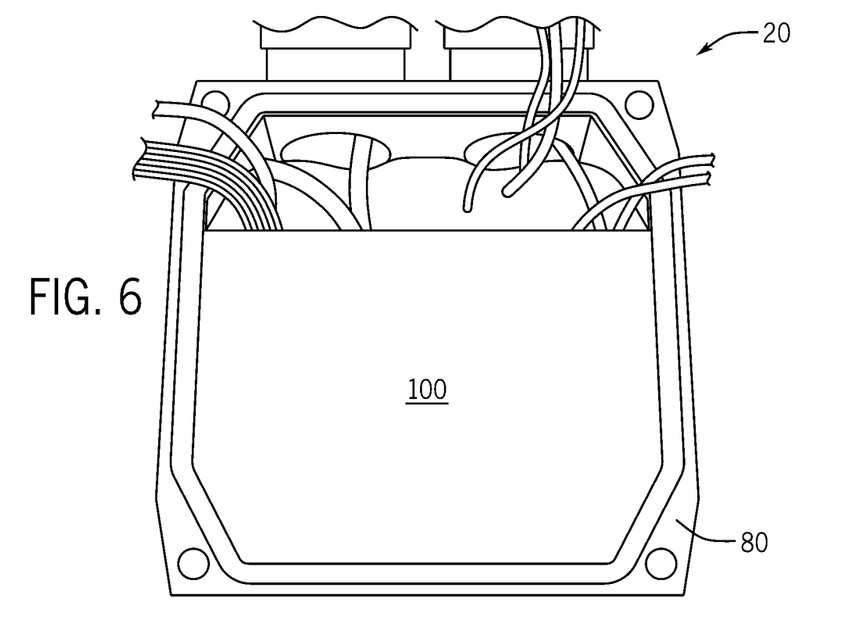
FIG. 6 is a top plan view of an exemplary integrated motor drive illustrating potting material within the integrated motor drive.

Turning next to FIG. 4, one embodiment of an integrated motor drive before insertion of potting material 100 is illustrated. The motor drive 20 includes a housing 80 where the sides 86 are shown as transparent to view the arrangement of circuit boards 90 within the motor drive. The housing 80 includes a first end 82, configured to be mounted to an end of a housing for the motor 10, and a second end 84 opposite the first end. Four sides 86 extend between the first end 82 and the second end 84 to define a box-like structure for the housing 80. With reference also to FIG. 5, a volume 85 is defined within an interior of the housing 80. The volume 85 extends from an inner surface of the first end 82 to an inner surface of the second end 84 and within the inner periphery of each side 86.

According to the embodiment illustrated in FIG. 4, three circuit boards 90 are inserted into the volume 85 of the housing 80. An end cap 87 on the first end 82 of the housing may be removed to allow insertion into the housing 80. It is contemplated that the interior surface of the second end 84 may include a mounting bracket in which each circuit board 90 is inserted. It is contemplated that a first circuit board 90A and a third circuit board 90C generally include the processor 55, memory 60 and all additional logical components for the control section 23 of the motor drive 20. The second circuit board 90B may generally include the power switching devices 35 and each of the other components from the power section 21 of the motor drive. The illustrated embodiment is not intended to be limiting and it is contemplated that there may be either less than or more than three circuit boards 90 included within the integrated motor drive 20. It is further contemplated that components from the control section 23 or from the power section 21 may be distributed among any combination of circuit boards 90 according to application requirements. After inserting the circuit boards 90 into the volume 85 of the housing 80 and making any required electrical connections to the circuit boards, the remainder of the volume is filled with a potting material 100 to at least a sufficient height to cover the circuit boards 90.

Figure 7:
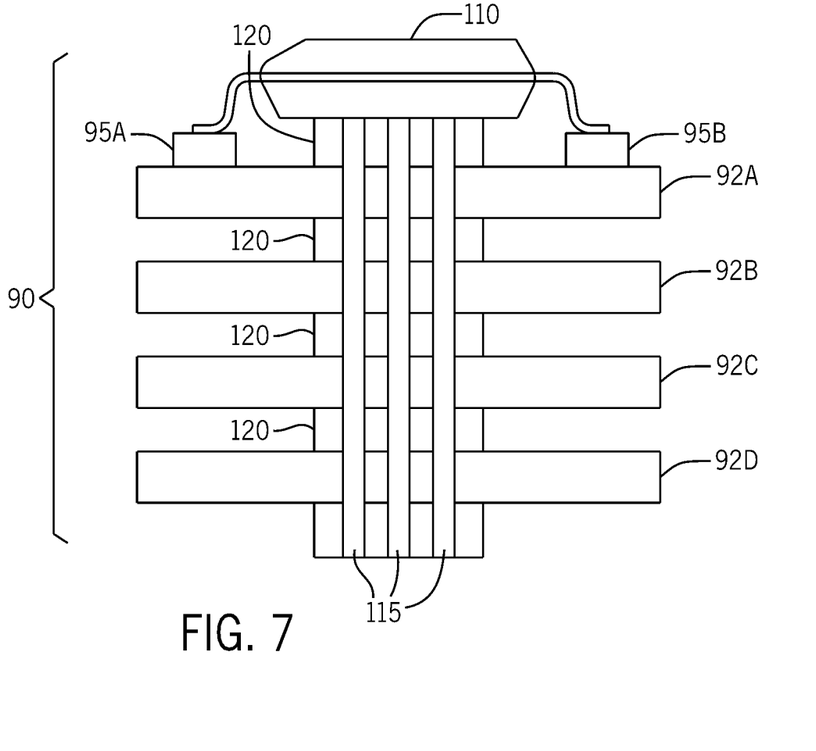
FIG. 7 is a partial sectional view of an exemplary power switching device utilized in one embodiment of the invention mounted to a circuit board.

With reference to FIG. 7, an integrated circuit package 110 may include one or more MOSFETs 35. The integrated circuit package 110 is mounted to one of the circuit boards 90. Each circuit board 90 is a multi-layer board. According to the illustrated embodiment, the circuit board 90 includes four layers 92A-92D. The number of illustrated layers is not intended to be limiting and it is contemplated that the circuit board 90 may have fewer than or greater than four layers 92A-92D. The integrated circuit package 110 is mounted to solder pads 95 on the first layer 92A of the circuit board. A first solder pad 95A and a second solder pad 95B are illustrated for each of two terminals from the integrated circuit package 110. Each terminal would be mounted to a separate solder pad. The solder pads 95 are connected via traces on the circuit board to other electronic devices according to the circuit board layout and design.

Each layer 92 of the circuit board 90 is typically made up of a dielectric material. Each dielectric material is electrically insulating and is commonly a poor thermal conductor as well. To improve thermal conduction from the first layer 92A of the circuit board 90 to the fourth layer 92D of the circuit board, a series of thermal vias 115 are located beneath the footprint of the integrated circuit package 110. Additionally, the copper material 120 from which traces may be formed is left beneath the integrated circuit package 110 and between each layer 92. The vias 115 are also copper material and may be filled, providing a solid copper path between the layers 92 of the circuit board 90. The integrated circuit package 110 may be electrically mounted to the solder pads 95 and the body of the integrated circuit package 110 may contact or be located proximate a top layer of copper material 120. The body of the integrated circuit package 110 is not electrically conductive, but heat radiates or is conducted from the body of the integrated circuit package 110 to the copper layer 120 and through the vias 115 to the lower surface of the circuit board 90.

During operation of the motor drive 20, the potting material 100 is configured to provide a thermal conduction path for heat generated within each integrated circuit package 110 to the housing 80 for the motor drive. As previously discussed, the MOSFETs 35 in the inverter section 30 of the integrated motor drive 20 generate heat during operation. Switching losses, conduction losses, and parasitic losses, result in heat being built up within each of the integrated circuit packages 110. Because the potting material 100 envelopes the circuit boards 90, potting material 100 is in contact with a top surface of the integrated circuit package 110, as well as the outer layers 92 of the circuit board 90. A portion of the heat generated in each integrated circuit package 110 is transmitted through the circuit board 90 via the thermal vias 115 and the copper material 120 in the circuit board 90. Another portion of the heat generated in each integrated circuit package 110 is transmitted directly to the potting material 100. Some of the heat which is initially transmitted through the circuit board 90 may radiate outward within the circuit board 90. The potting material 100 is in contact with the circuit board 90 and with the thermal vias 115 and copper material 120 on the lower layer 92D of the circuit board. Thus, the heat generated by the MOSFETs 35 within the integrated circuit packages 110 is conducted either directly from the integrated circuit package or indirectly via the circuit board 90 to the potting material 100.

Historically, potting material is typically used on circuit boards in small amounts to help affix a circuit component to the circuit board. For example, a lead-mounted capacitor may have leads inserted through and then soldered to the circuit board. The body of the capacitor extends away from the circuit board. However, vibration on the device in which the circuit board is mounted may cause the body of the capacitor to similarly vibrate. Over time, the vibration may cause the leads to move back and forth and eventually break off from the circuit board. Potting material may be applied at the base of the capacitor which becomes rigid when dried. The potting material holds the lead-mounted capacitor to the circuit board and helps prevent vibration between the component and the board which, in turn, helps prevent a failure of the connection to the board. This potting material, however, is not suitable for use in large amounts to fill the volume 85 within the housing 80 of the motor drive 20.

The present inventors have determined that a potting material 100 which has good thermal conductivity and which has some elasticity is desirable for filling the volume 85 of the housing 80. Many potting materials are thermally insulating materials. The present invention contemplates using the potting material 100 to establish a thermal conduction path between the circuit board 90 and the housing 80 of the motor drive 20. According to one aspect of the invention, the potting material 100 has a thermal conductivity of at least 0.75 W/(m·K). According to a preferred embodiment of the invention, the potting material 100 has a thermal conductivity of at least 1 W/(m·K).

Additionally, the potting material 100 will be conducting heat away from the switching devices 35 in the inverter section 30 of the motor drive 20. In some applications, a motor 10 may operate in a near continuous operating state, such that a constant amount of thermal energy is generated by the switching devices 35. In other applications, a motor 10 may start and stop for varying durations of time. During periods of operation, thermal energy is generated by the switching devices 35 which, in turn, is transferred to and heats the potting material 100. During periods of inactivity, no thermal energy is generated by the switching devices 35, allowing the heat within the potting material 100 to dissipate through the housing 80, cooling the potting material 100. Heating and cooling of the potting material 100 will cause expansion and contraction of the potting material 100. If a rigid potting material is selected, as discussed above, the expansion and contraction of the potting material would exert force on the electronic components mounted to the circuit boards 90. Expansion and contraction of a rigid material could damage the components on the circuit boards 90. Thus, potting material 100 with some elasticity is desirable.

In order to allow expansion and contraction of the potting material 100 within the volume 85 of the housing 80 and avoid damaging components on the circuit boards 90, a soft potting material 100 is selected. The soft potting material 100 allows for compression against an electronic component without pushing the component off of the circuit board 90. The soft potting material further allows for the potting material to expand upward within an upper void 89 within the housing 80. The potting material 100 is filled within the housing 80 for a sufficient volume 85 to cover the circuit boards 90. The potting material envelopes the circuit boards and fills the volume 85 around the circuit boards 90 to an inner periphery of the housing 80 for the motor drive 20. However, some volume is retained above the potting material 100 to define the upper void 89 when the end cap 87 is affixed to the housing 80. According to one aspect of the invention, the potting material 100 has a hardness less than or equal to seventy on a Shore A hardness scale. According to a preferred embodiment of the invention, the potting material 100 has a hardness less than or equal to 30 on the Shore A hardness scale. According to one embodiment of the invention, LOCTITE® SI 5633™ is selected as the potting material 100.

Use of the potting material 100 within the integrated motor drive 20 and mounting the housing 80 for the motor drive 20 to the end of the motor housing, allows for operation of the integrated motor drive 20 with little or no derating of the motor drive 20 in comparison to a cabinet-mounted motor dive. Previous integrated motor drives using DBC and mounting to a side surface of the motor required derating of the motor drive between about thirty and forty percent (30-40%). Eliminating the prior derating allows motor drives of smaller size and less cost to be mounted to the motor 10 for an integrated motor drive package.

It should be understood that the invention is not limited in its application to the details of construction and arrangements of the components set forth herein. The invention is capable of other embodiments and of being practiced or carried out in various ways. Variations and modifications of the foregoing are within the scope of the present invention. It also being understood that the invention disclosed and defined herein extends to all alternative combinations of two or more of the individual features mentioned or evident from the text and/or drawings. All of these different combinations constitute various alternative aspects of the present invention. The embodiments described herein explain the best modes known for practicing the invention and will enable others skilled in the art to utilize the invention.

In the preceding specification, various embodiments have been described with reference to the accompanying drawings. It will, however, be evident that various modifications and changes may be made thereto, and additional embodiments may be implemented, without departing from the broader scope of the invention as set forth in the claims that follow. The specification and drawings are accordingly to be regarded in an illustrative rather than restrictive sense.

We claim:

1. A system for cooling switching devices in a motor drive, the system comprising:
    a housing for the motor drive, wherein:
        the housing for the motor drive is configured to mount to a motor housing, and
        a volume is defined within an inner periphery of the housing;
    at least one switching device mounted within the motor drive, wherein:
        the at least one switching device is operatively controlled to convert a first voltage present on a DC bus within the motor drive to a second voltage present at an output of the motor drive, and
        the second voltage is configured to control operation of a motor to which the motor drive is mounted;
    a circuit board including a first side and a second side, wherein:
        the second side is opposite the first side,
        each of the at least one switching devices is mounted on the first side of the circuit board,
        at least one thermal via extends between the first side and the second side of the circuit board,
        a first end of the at least one thermal via is positioned where each of the at least one switching devices is mounted,
        the circuit board is mounted within the volume of the housing for the motor drive; and
    a potting material, wherein:
        the potting material is positioned within the volume of the housing for the motor drive,
        the potting material covers the at least one switching device mounted on the first side of the circuit board and extends from the first side the circuit board to the inner periphery of the housing for the motor drive to conduct a first portion of heat generated by the at least one switching device to the inner periphery of the housing, and
        the potting material covers a second end of the at least one thermal via on the second side of the circuit board and extends from the second side of the circuit board to the inner periphery of the housing for the motor drive to conduct a second portion of heat generated by the at least one switching device by the at least one thermal via and the potting material to the inner periphery of the housing.

2. The system of claim 1 wherein the housing for the motor drive is further configured to mount to an end of the motor housing.

3. The system of claim 1 wherein the potting material has a Shore hardness rating less than or equal to 70A.

4. The system of claim 3 wherein the Shore hardness rating is less than or equal to 30A.

5. The system of claim 1 wherein the potting material has a thermal conductivity greater than or equal to 0.75 W/(m·K).

6. The system of claim 5 wherein the thermal conductivity is greater than or equal to 1 W/(m·K).

7. The system of claim 1 wherein each of the at least one switching devices is mounted to the circuit board using a pick and place machine.

8. The system of claim 1 wherein:
    the volume of the housing includes a first end, a second end, and the inner periphery, the first end is opposite the second end, the inner periphery includes at least one side wall extending between the first end and the second end, the circuit board is mounted at the first end of the volume, and the potting material fills the volume between the inner periphery and extending from the first end for a length of the volume at least as long as a length of the circuit board.

9. The system of claim 1 wherein the second voltage is greater than or equal to 200 VAC.

10. A method for cooling switching devices in a motor drive, the system comprising:

mounting at least one switching device to a circuit board, wherein the circuit board includes:
- a first side on which the at least one switching device is mounted,
- a second side opposite the first side, and
- at least one thermal via extending between the first side and the second side of the circuit board and positioned where the at least one switching devices is mounted;

mounting the circuit board with the at least one switching device in a housing for the motor drive, wherein the housing for the motor drive is configured to mount to a motor housing;

filling a volume within the housing with a potting material, wherein the potting material covers the at least one switching device mounted on the circuit board and extends from the circuit board to an inner periphery of the housing for the motor drive;

operatively controlling the at least one switching device to convert a first voltage present on a DC bus within the motor drive to a second voltage present at an output of the motor drive;

conducting a first portion of heat from the at least one switching device through the circuit board by the at least one thermal via;

conducting the first portion of the heat from the second side of the circuit board to the inner periphery of the housing for the motor drive via the potting material, and conducting a second portion of the heat from the at least one switching device to the inner periphery of the housing for the motor drive via the potting material.

11. The method of claim 10 further comprising the step of mounting the housing for the motor drive to an end of the motor housing.

12. The method of claim 10 wherein the potting material has a Shore hardness rating less than or equal to 70A.

13. The method of claim 10 wherein the Shore hardness rating is less than or equal to 30A.

14. The method of claim 10 wherein the potting material has a thermal conductivity greater than or equal to 0.75 W/(m·K).

15. The method of claim 14 wherein the thermal conductivity is greater than or equal to 1 W/(m·K).

16. The method of claim 10 wherein the step of mounting the at least one switching device to the circuit board uses a pick and place machine.

17. The method of claim 10 wherein:
the volume of the housing includes a first end, a second end, and the inner periphery, the first end is opposite the second end, the inner periphery includes at least one side wall extending between the first end and the second end, the circuit board is mounted at the first end of the volume, and the potting material fills the volume between the inner periphery and extending from the first end for a length of the volume at least as long as a length of the circuit board.

18. The method of claim 10 wherein the second voltage is greater than or equal to 200 VAC.

* * * * *